United States Patent
Bidenbach et al.

(10) Patent No.: US 7,492,178 B2
(45) Date of Patent: Feb. 17, 2009

(54) METHOD AND APPARATUS FOR TESTING A HALL MAGNETIC FIELD SENSOR ON A WAFER

(75) Inventors: Reiner Bidenbach, Vörstetten (DE); Jens Schubert, Gundelfingen (DE); Stefan Kredler, Heuweiler (DE); Ralf Janke, Denzlingen (DE)

(73) Assignee: Micronas GmbH, Freiburg (DE)

( * ) Notice: Subject to any disclaimer, the term of this patent is extended or adjusted under 35 U.S.C. 154(b) by 40 days.

(21) Appl. No.: 11/455,912

(22) Filed: Jun. 19, 2006

(65) Prior Publication Data

US 2006/0284612 A1    Dec. 21, 2006

(30) Foreign Application Priority Data

Jun. 17, 2005    (DE) .................. 10 2005 028 461

(51) Int. Cl.
*G01R 31/02*    (2006.01)
(52) U.S. Cl. ....................................... 324/763
(58) Field of Classification Search ............... None
See application file for complete search history.

(56) References Cited

U.S. PATENT DOCUMENTS

| | | | |
|---|---|---|---|
| 3,487,301 A * | 12/1969 | Gardner et al. ............. | 324/717 |
| 4,857,839 A | 8/1989 | Look et al. .................. | 324/158 |
| 5,150,042 A | 9/1992 | Look et al. | |
| 5,169,485 A * | 12/1992 | Allen et al. ................. | 148/101 |
| 5,614,754 A * | 3/1997 | Inoue ......................... | 257/421 |
| 6,154,027 A | 11/2000 | Alexander et al. .......... | 324/251 |
| 6,362,618 B1 | 3/2002 | Motz ........................... | 324/251 |
| 2002/0028456 A1 | 3/2002 | Mansky et al. .............. | 435/6 |

FOREIGN PATENT DOCUMENTS

| | | | |
|---|---|---|---|
| CH | 682017 | 6/1993 | .............. 31/26 |
| EP | 0 631 147 | 12/1994 | |
| GB | 860200 | 2/1961 | |
| GB | 1144155 | 3/1969 | |

* cited by examiner

*Primary Examiner*—Vinh P Nguyen
(74) *Attorney, Agent, or Firm*—O'Shea Getz P.C.

(57) ABSTRACT

A method for testing a Hall magnetic field sensor on a wafer includes generating a current flow in a Hall plate of the Hall magnetic field sensor. At least one voltage value across first and second nodes is measured and a measured voltage signal is provided indicative thereof. An electrical resistance based upon the measured voltage and the current is then determined, in the absence of an applied test magnet field.

11 Claims, 1 Drawing Sheet

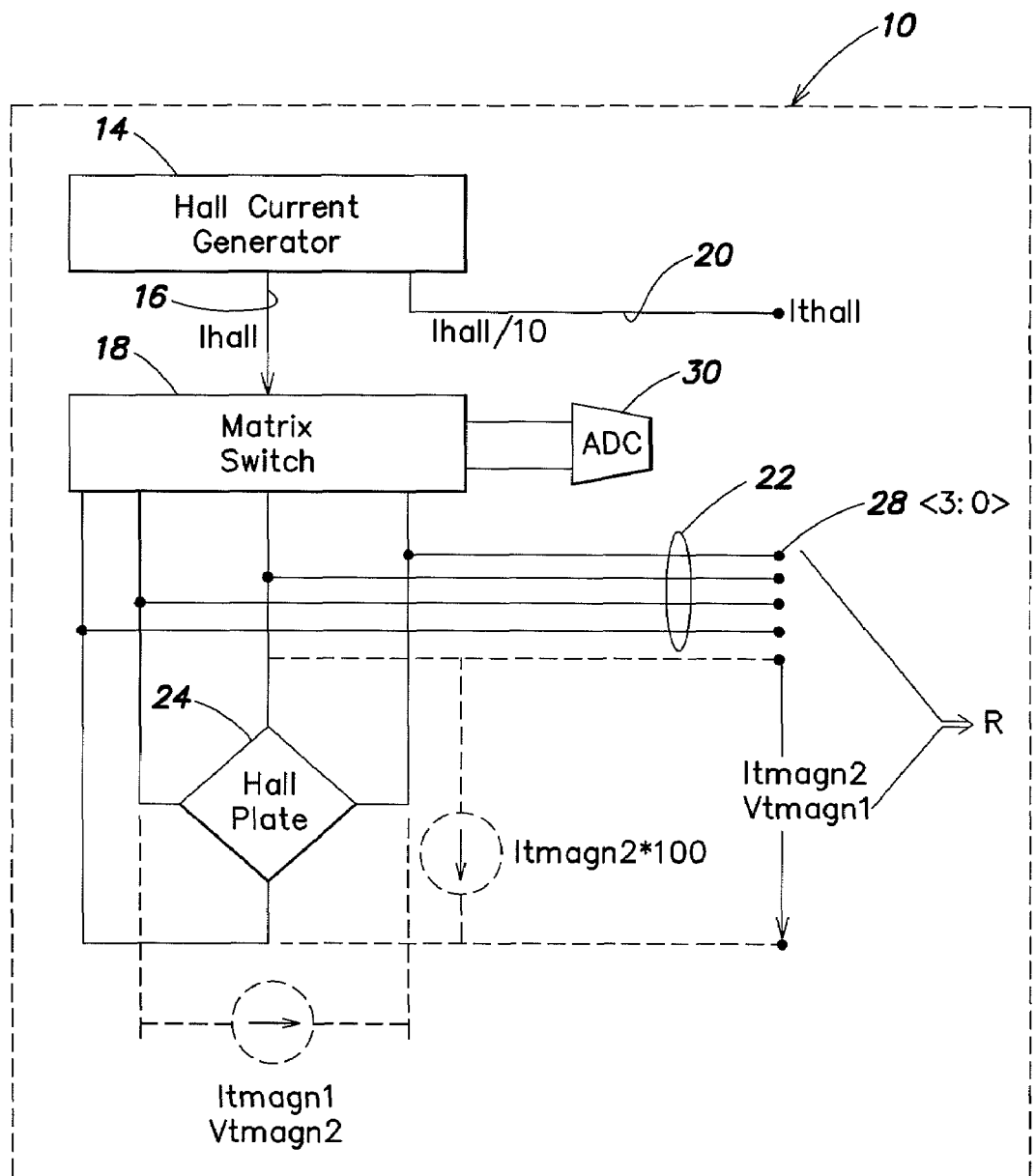
FIGURE

METHOD AND APPARATUS FOR TESTING A HALL MAGNETIC FIELD SENSOR ON A WAFER

PRIORITY INFORMATION

This patent application claims priority from German patent application 10 2005 028 461.2 filed Jun. 17, 2005, which is hereby incorporated by reference.

BACKGROUND OF THE INVENTION

The invention relates to testing a semiconductor wafer, and in particular to testing a Hall magnetic field sensor.

Magnetic fields are used for testing of semiconductor wafers, especially Hall magnetic field sensors, during a production test as part of the manufacturing process. Generating precise magnetic fields suitable for a test with commercially available mixed-signal testing systems is not possible without additional devices, so an additional and undesirable hardware expense is incurred. Since different magnetic field strengths are usually needed for a test, one must expect relatively long transient times for the coils producing them, or a complicated mechanical system. In addition, because the homogeneous region of the magnetic field produced in this way is relatively small, only a few sensors can be tested at the same time on a wafer.

Since a Helmholtz layout is not possible for the coils producing such a magnetic field for a wafer test with a thermochuck, one can only provide an inexact magnetic field for the testing or sampling. Such a thermochuck provides a desired wafer temperature, and the wafer lies on it over its entire surface. Currents flow in the thermochuck, generating disruptive magnetic fields. Furthermore, the thermochuck normally contains magnetic materials that distort the desired magnetic measuring field. In particular, for a Helmholtz layout one would require a coil in the thermochuck, which would be difficult to implement, so that in the final analysis there are many problems with magnetic measurements of a wafer in conjunction with a thermochuck.

There is a need for an improved technique of testing a semiconductor wafer such as a Hall effect sensor.

SUMMARY OF THE INVENTION

According to an aspect of the present invention, a wafer is tested by current flow produced in the wafer to determine electrical resistance. The wafer may include a Hall magnetic field sensor.

The wafer may include at least one Hall plate, a matrix switch, and taps for applying and/or picking off currents and/or voltages, wherein the taps have taps for applying a metering current and taps for measuring a current flow and/or a voltage based on the metering current in order to determine an electrical resistance of the wafer, the Hall plate, and/or a signal pathway including the Hall plate. The wafer may be configured as a Hall sensor.

Test techniques of the present invention enable the testing of wafers or Hall magnetic field sensors in the absence of an applied magnetic field. That is, the technique of the present invention proceeds without the need for magnetic fields to be applied from the outside. This saves on testing time, reduces the testing hardware expense, and provides improved possibilities for parallel tests.

The resistance of the wafer or the Hall plate may be determined. For example, the resistance of a signal pathway including the Hall plate and a matrix switch may be determined. The matrix switch may be configured to actuate the Hall plate to measure a magnetic field.

The technique for measuring magnetic sensitivity may be performed in the absence of an applied magnetic field. The layout with at least the Hall plate may be screened off from external magnetic fields.

An additional measurement may be performed with a direction of current flow through the wafer or the Hall plate that differs from the direction of current flow of the first of preceding measurement.

A metering current may be applied to the wafer or at least to the Hall plate. A copy of the metering current used internally in the wafer or at least in the Hall plate may be switched to the outside for the measuring process. A voltage equivalent to the Hall voltage and induced by the current flow may be picked off to perform the measuring process. The resistance may be determined by an applied and/or measured applied current and a measured voltage. Currents measured in the layout may be amplified within the layout and output in the amplified state for the evaluation. The behavior of an evaluation circuit contained in the signal pathway may also be determined to carry out the measurement process. Components contained in the signal pathway downstream from the Hall plate may be included in the evaluation circuit.

A wafer or Hall sensor with an evaluation circuit in the signal pathway of the Hall plate, wherein the determined electrical resistance also detects the influence of the evaluation circuit. The evaluation circuit in the signal pathway of the Hall plate enables testing of the evaluation circuit by an applied Hall current. In this way, it is also possible to check the further signal pathway by generating a signal, such as would also be generated by a magnetic field.

The entire signal pathway of a transmitter IC is tested by an electric stimulation. For this, additional currents are impressed in a test mode in the Hall plates, or alternatively it is also possible to impress a voltage which induces such a test current or metering current. These currents may be advantageously generated in the sensor itself. The precise value of these currents may be determined in that these currents or copies of these currents are switched to the outside in an additional test mode, or alternatively they are assigned from the outside. In this way, it is possible to test not only the Hall plates but also the entire signal pathway of such an integrated sensor.

To test the Hall plates themselves, one can determine their electrical resistance or another parameter indicative of the magnetic sensitivity. For this, for example the activating Hall plate current or a copy or fraction thereof can be switched to the outside and measured. In combination with the voltage then dropping across the Hall plate, one can subsequently determine the electrical resistance. For a given semiconductor material and a given geometry of the Hall plate, one can thereby determine the concentration of dopants and thus also the Hall sensitivity. The same holds for a varying geometry and a given concentration of dopant.

These and other objects, features and advantages of the present invention will become more apparent in light of the following detailed description of preferred embodiments thereof, as illustrated in the accompanying drawings.

BRIEF DESCRIPTION OF THE DRAWINGS

The FIGURE is a block diagram illustration of components for testing a Hall sensor on a wafer.

DETAILED DESCRIPTION OF THE INVENTION

The FIGURE illustrates a block diagram illustration of a layout of components on a wafer or a corresponding Hall sensor configured in such a way that a metering current may be applied to check individual components, and especially the components of a signal pathway with respect to their electrical resistance R. From the electrical resistance the quality of the investigated segment can be determined, without having to apply an external magnetic field. One application which is advantageous is integrated Hall sensors with evaluation circuits.

A portion of a wafer 10 is shown for configuring an integrated circuit sensor. A reference current from a bias generator is input to a Hall current generator 14. Thus, the currents are generated in the bias generator, which provides reference currents and reference voltages for practically all the analog circuits on the sensor. The Hall current generator 14 outputs a Hall current as a metering current Ihall on a line 16 to a matrix switch 18. The Hall current generator 14 outputs via a preferably independent output an additional current Ihall/10 on a line 20 to a metering current tap Ithall. The current switched in this way to the outside is a copy of the testing or metering currents Ihall on the line 16 used internally, to avoid interference coupled in from the outside.

The matrix switch 18 may be connected by a plurality of lines 22 to a Hall plate 24, and the terminals on the Hall plate 24 preferably lie at its corners. With this matrix switch 18, a Hall plate current Itmagn1 produced by the Hall current Ihall on the line 16 can be switched in to enable a current flow in the 0° direction or 90° direction through the Hall plate 24. The matrix switch 18 may be used to switch the taps for picking off a Hall voltage. Preferably, switching in the 0° direction, 90° direction, 1800 direction and 270° direction relative to the applied Hall plate current Itmagn1, Itmagn2 or the picked-off Hall voltage is made possible by the matrix switch 18, to avoid a magnetic offset caused by mechanical stresses or non-ideal features of the Hall plates.

Preferably, from each of the lines between the matrix switch 18 and the Hall plate 24 a line branches off to a corresponding tap 28 (e.g., a four-pole tap). These four taps allow for the provision of corresponding signals 0 to 3, which are used to determine Hall plate resistance R. Depending on the settings of the matrix switch 18 (i.e., which two lines apply the Hall plate current Itmagn1,2 to the Hall plate 24) two of the four measuring taps 28 pick off the resulting generated Hall plate voltage Vtmagn1-Vtmagn2. From the Hall current Ithall and the Hall plate voltage Vtmagn1-Vtmagn2, one can now determine the Hall plate resistance.

Advantageously, such a layout allows one to measure the Hall plate 24 with two independent measurements in the vertical and horizontal direction relative to its resistance.

The circuit layout may also have an analog-digital converter (ADC) 30, being connected to the matrix switch 18, to convert the Hall voltage into a proportional current. Such an ADC input offers advantages, but it is not necessary to realize the inventive technique of the present invention.

During an additional test measurement, the impressed metering current Itmagn1,2 produces, on account of the resistance of the Hall plate 24, a voltage equivalent to the Hall voltage, which through the ADC 30 may stimulate the entire signal processing chain.

In the case of disruptive magnetic fields present in the surroundings of the measurement layout, one may use differential measurements with different metering currents to calculate the impact of such existing magnetic fields.

Depending on the strength of the imposed or measured currents, it may be desirable to amplify or attenuate such currents for measurement purposes. Determination of the resistance R is preferably performed by bringing to the outside a possibly scaled copy of the Hall plate current Itmagn1,2 and the voltage drop Vtmagn1,2 across the Hall plate 24, this being configured, depending on the design, as a parallel measuring tap or serially across an individual connection pin as the measuring terminal.

Due to the resistance determined in one or more directions, one can determine the geometry of the Hall plate 24, as well as the resulting dopant concentration or, through this, the Hall sensitivity of the Hall plate 24. Fluctuations and errors in the geometry of the Hall plate 24, as well as fluctuations in the dopant concentration of the Hall plate 24, can therefore be detected by deviations of the resistance.

The foregoing describes, in particular, the inspection of the Hall plate 24 by determining its resistance. However, one may determine not just the electrical resistance of the Hall plate 24 or, in a hierarchical arrangement with several Hall plates 24, the electrical resistance of a plurality of Hall plates. It is especially advantageous to determine the electrical resistance not only of the Hall plate 24, but also the entire signal pathway, including the Hall plates 24 and the matrix switch 18, for which one uses, when determining the resistance, also and in particular the metering current Ithall that can be picked off from the metering current tap. Since test signals and the metering current Ithall are also routed through the matrix switch 18, this also is checked as part of the signal pathway. Thus, a complete signal pathway (e.g., a Hall sensor with evaluation circuit) can be checked in its entirety by an electrical stimulation. The evaluation circuit in this case includes the structural elements on the wafer 10, especially those downstream from the Hall plate 24.

Although the present invention has been illustrated and described with respect to several preferred embodiments thereof, various changes, omissions and additions to the form and detail thereof, may be made therein, without departing from the spirit and scope of the invention.

What is claimed is:

1. A method for testing a Hall magnetic field sensor on a wafer, comprising:

generating a current flow in a Hall plate of the Hall magnetic field sensor;

measuring at least one voltage value across first and second nodes of the Hall plate and providing a measured voltage signal indicative thereof; and determining an electrical resistance based upon the measured voltage and the current, in the absence of an applied test magnetic field, where the step of determining comprises determining resistance of a signal pathway including the Hall plate and a matrix switch.

2. The method of claim 1, where the matrix switch is configured to activate the Hall plate to measure a magnetic field.

3. The method of claim 1, comprising first screening off at least the Hall plate from external magnetic fields to attenuate the external magnetic field seen at the Hall plate.

4. The method of claim 1, where an additional measurement is performed with a direction of current flow through the Hall plate that differs from the direction of current flow of the previous measurement.

5. The method of claim 1, where a metering/test current is applied to the Hall plate.

6. The method of claim 5, where a copy of the metering current used internally in the Hall plate is switched to the outside for the measurement.

7. The method of claim 1, where a voltage equivalent to the Hall voltage induced by the current flow is picked off to perform the measurement.

8. The method of claim 1, where currents measured in the wafer are amplified within the wafer and output in amplified state for the evaluation.

9. The method of claim 1, where the behavior of an evaluation circuit contained in the signal pathway is also measured or determined to carry out the test procedure.

10. The method of claim 9, where components contained in the signal pathway downstream from the Hall plate belong to the evaluation circuit.

11. The semiconductor wafer comprising:
a Hall plate having a plurality of terminals;
a matrix switch that receives a metering/test current and selectively applies the test current through a selected two of the plurality of terminals;
a plurality of taps for applying and/or picking off currents and/or voltages from the Hall plate caused by the test current being applied to the selected two of the plurality of terminals;
wherein the plurality of taps includes taps for measuring the metering/test current and taps for measuring a voltage on the basis of the metering/test current in order to determine an electrical resistance of the wafer, the Hall plate, and/or a signal pathway including the Hall plate and the matrix switch.

* * * * *